United States Patent [19]

Logan

[11] Patent Number: 4,476,433
[45] Date of Patent: Oct. 9, 1984

[54] ELECTRONIC TEST FIXTURE

[76] Inventor: John K. Logan, 26527 Silver Spur Rd., Rancho Palos Verdes, Calif. 90274

[21] Appl. No.: 415,339

[22] Filed: Sep. 7, 1982

[51] Int. Cl.³ .............................................. G01R 1/06
[52] U.S. Cl. .......................... 324/158 P; 339/108 TP
[58] Field of Search .......... 324/158 P, 158 F, 73 PC; 339/108 TP

[56] References Cited

U.S. PATENT DOCUMENTS

| | | | |
|---|---|---|---|
| 3,806,801 | 4/1974 | Bove .............................. | 339/108 TP |
| 3,906,363 | 9/1975 | Fowler . | |
| 4,038,599 | 7/1977 | Bove et al. ...................... | 324/158 P |
| 4,061,969 | 12/1977 | Dean . | |
| 4,063,172 | 12/1977 | Faure et al. .. | |
| 4,126,380 | 11/1978 | Borm .............................. | 324/158 P |
| 4,285,563 | 8/1981 | Crosier et al. . | |
| 4,298,239 | 11/1981 | Montalto et al. . | |
| 4,423,373 | 12/1983 | LeCroy, Jr. ..................... | 324/158 P |

FOREIGN PATENT DOCUMENTS 53-3077   4/1978   Japan ............................... 324/158 P Primary Examiner—Stewart J. Levy
Attorney, Agent, or Firm—Gordon K. Anderson

[57] ABSTRACT

A continuity testing fixture for simultaneously probing of microelectronic chip site pads having a cluster of probe pins extending from a top plate in the same precise orientation as the pads. The probe pins are individually urged into compliance by a resilient pad disposed beneath the pins forcing a sharp end into contiguous engagement allowing an external signal to determine continuity of the workpiece. Individual insulated wires are attached to each probe on one end and are encompassed within a cavity in the body terminating at a connector near the edge of the fixture for linking to the remote test source. In another embodiment, the probe pins are hollow and contain an insulated wire allowing an independent signal to be introduced by way of the connector through the pads indicating both compliance of the probe and continuity of the workpiece simultaneously and independently.

4 Claims, 8 Drawing Figures

ELECTRONIC TEST FIXTURE

BACKGROUND OF THE INVENTION

1. Field of the Invention

This invention relates to electrical measurement for testing using voltage probes with a panel circuit arrangement having electrical connectors in general, more particularly to microelectronic circuit board or chip node point and inspection point continuity testing fixtures.

2. Description of Prior Art

Structures for probing small pads in close proximity have been known and in use for some time, however, due to inherent problems of maintaining conformance of the probe to the site and area, limitations for ultra close spacing prior art has not, as yet, filled the need for the still advancing technology.

One such device utilizes spring loaded probes or so called by the industry, a "bed-of-nails" contact fixture. These fixtures consist of individual spring loaded probes that are pressed into holes drilled in insulating material, such as a flat sheet. The probes fixtures are used for contacting large area devices, such as printed circuit boards, and the like. This design, however, limits the spacing to no less than 0.050" (1.27 MM) center-to-center, due to the minimum diameter of the spring and the capabilities to wind a wire in coil configuration insertable into a probe.

Another such device is taught by Fowler in U.S. Pat. No. 3,906,363 wherein a wire is positioned between two plates with one end restrained and the other slideably engaged. The moveable end projects through the plate and contacts the element under test. The wire or needle deforms within its elastic limits, as a collapsing column when pressed onto the node points of the workpiece. The expense of drilling two corresponding plates is high and the needles have a tendency to run into each other when depressed limiting the reliability of this art.

U.S. Pat. No. 4,061,969 issued to Dean employs a series of pins embedded into a sealed flexible membrane with wires attached to the pins passing through an airtight seal. A vacuum is pulled within a chamber formed by the membrane causing the pins to obtain conformance with the workpiece under this negative pneumatic pressure. Dean also takes advantage of the previously described spring loaded probes in another embodiment.

Faure et al in U.S. Pat. No. 4,063,172 entitled, Multiple Site, Differential Displacement, Surface Contacting Assembly, applies a group of probes for multiple site chip clusters with a plurality of cams cooperating with followers to independently locate each cluster or groups of probes so as to compensate for accumulated tolerance or shrinkage in long substrates. Clusters of probes are moved with a single adjustment laterally as a group with the probes taking advantage of the collapsing column or buckling beam configuration for compliance.

Prior art also utilizes a fixed point probe card consisting of needle point probes mounted on printed circuit boards. These fixtures are widely used for probing integrated circuits and small geometry devices. This art is limited in its physical size as no more than 150 points per square inch (23 points per square centimeter) and about 200 probes total can be mounted on a single probe card. This limitation exists due to the fact that the probes are mounted pointing axially around a circle with a flat horizontal spring action providing the necessary conformance to the substrate pads.

For background purposes and as indicative of the art to which this invention relates, reference may be made to U.S. Pat. No. 4,285,563 issued to Crosier et al and also U.S. Pat. No. 4,298,239 of Montalto et al entitled, Test Access Apparatus.

SUMMARY OF THE INVENTION

As technology in printed substrates on boards has rapidly advanced, likewise the method of testing has become more complex. Printed circuit boards have been tested successfully for some time with fixtures containing probes contiguous with the node and inspection points. A signal is generated by some type of computerized device, as an example, dual in line integrated circuit packages are used for testing integrated circuits, allowing continuity to be established between the traces of the substrate. A major problem has arisen as the boards are reduced in size to hybrid circuits, integrated circuits, chip-carrier mounted integrated circuits, and the like having very dense modal spacing. Prior art is limited in the number of probes that can be physically located in one area therefore, it is the primary object of the instant invention to achieve up to 2,500 points per square inch (388 points per square centimeter) contacted simultaneously. This allows the probe points to be as close as 0.020 inch (0.508 millimeters) individual spacing each achieving separate compliance. An important object provides an unlimited number of probes to be built into the fixture of this density, as the quantity is not governed by a physical limitation of size. Connectors of any configuration suitable for the application may be utilized with the attaching wires and all four sides may be used for connector location.

Another object of the invention employs the use of only a single set of holes to be drilled to accomodate the probes. As accurate drilling of these diminutive bores represents considerable expense, the importance of this object cannot be underrated.

Still another object in a separate embodiment of the invention provides a method of not only measuring continuity of the traces of the substrate, but also simultaneously applies an external signal to assure compliance of the probe itself to the pad. This object is achieved by utilizing an insulated wire within the probe so positioned as to retract internally when registered directly on the node point allowing an indicating device such as a light emitting diode to be illuminated.

Yet another object includes compliance of the probe to the substrate pads or points individually where chip site clusters vary in geometrical aray or are densely oriented. Each individual probe moves independently of the other by the unique method of the position of a resilient pad at the opposed end providing a continuing compressible force.

These and other objects and advantages of the present invention will become apparent from the subsequent detailed description of the preferred embodiment and the appended claims taken in conjunction with the accompanying drawing.

DESCRIPTION OF THE PREFERRED EMBODIMENT

Figure 1:
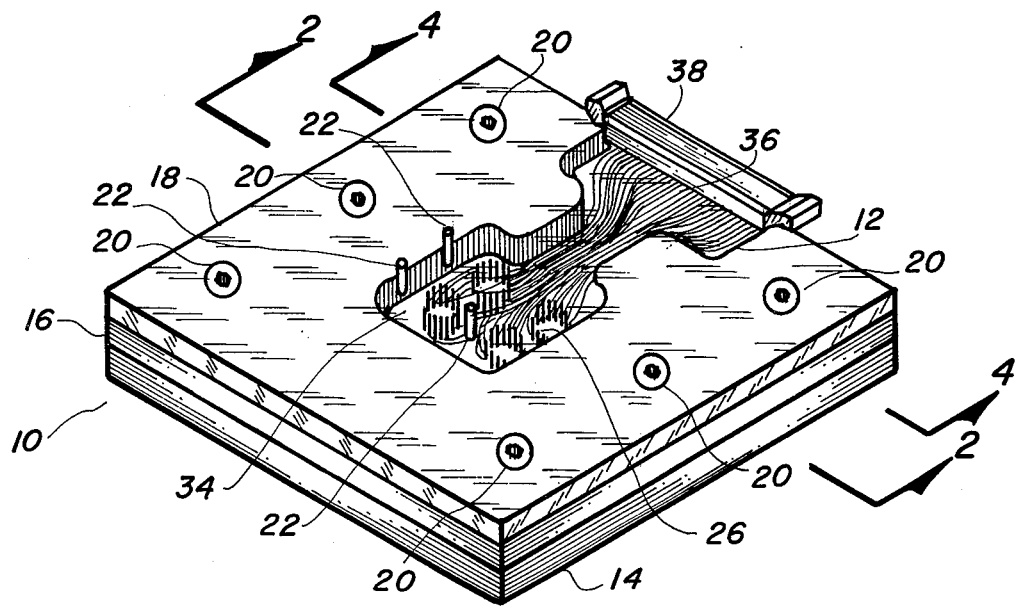
FIG. 1 is a partial isometric view of the preferred embodiment.
Figure 2:
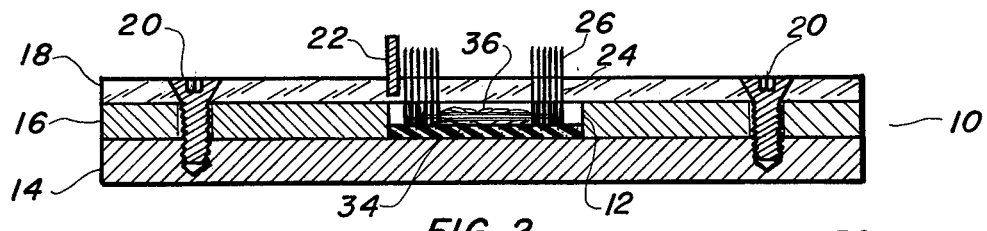
FIG. 2 is a cross-sectional view of the preferred embodiment illustrating a cluster of probes in the extended position taken along lines 2—2 of FIG. 1.
Figure 3:
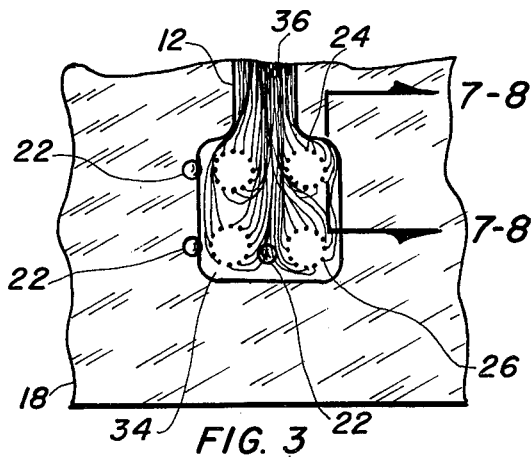
FIG. 3 is a partial plan view of the preferred embodiment indicating a configuration with four clusters of probes.

Referring now more specifically to the referenced characters of the drawing, the invention in the preferred embodiment, best depicted in FIG. 1, includes a body 10 having a cavity 12 centrally located therein. The cavity 12, best illustrated in FIGS. 2 and 4, may be in any configuration to match the size and structure of the workpiece. Basically, the cavity 12 is centrally located with a channel opening to one or more of the sides, however, it should not be limited to this configuration, as the only fundamental requirement is a parallel flat surface and a spacer rising planar thereto. The body 10 may be in one molded piece, however, the preferred embodiment consists of a base 14 on the bottom, in flat rectangular form, and a spacer 16 having a cavity 12 formed centrally inside with at least one side terminating at an edge. In configurations requiring two or more side terminations the spacer 16 may be in separate pieces as needed still having the same flat surfaces providing a spacer in planar relationship. A top plate 18 in flat rectangular shape, of the same configuration as the base 14 and spacer 16, is juxtapositioned to the spacer 16 and fastened with attaching means for containment of all three pieces. The means for attaching, shown best in FIG. 2, may be in any suitable form such as bonding, riveting, welding, with a plurality of threaded fasteners 20 being preferred. The fasteners 20 consist of multiple flat head capscrews penetrating the top plate 18 with countersunk holes, also clearance holes in the spacer 16 and threaded holes in the base 14. The material for the body 10 may be any combination of substances having the structural rigidity for the purpose, such as thermoplastics, i.e. nylons, acetates, acetals, polycarbonates, phenolics, epoxies, polyesters, and the like or metals, composition board, etc. The preferred material being aluminum for the base 14 and spacer 16 and thermoplastic for the top 18 in either opaque or transparent form.

A plurality of index fingers 22 are attached to the top plate 18 for positioning and indexing the workpiece on the top surface of the plate 18. These fingers 22 may be in any shape or form to accomplish a retainment position or in any spaced relationship, as the purpose is to provide stops at convenient locations to repeatedly index the workpiece in exactly the same position when placed upon the top surface. The fingers 22 may be attached by bonding, pressing into a forced fit, threading, or the like.

Figures 7, 8:
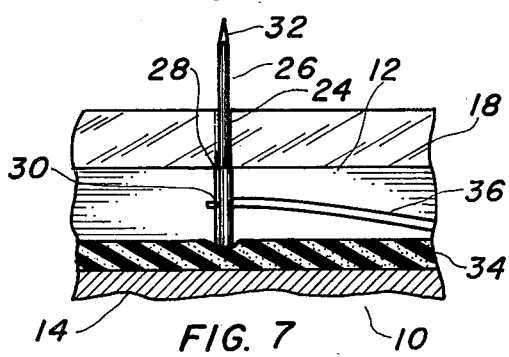
FIG. 7 is a partial sectional view of the preferred embodiment taken along lines 7—7 of FIG. 3 depicting the probe penetrating the top plate and deflecting the resilient material.
FIG. 8 is a partial sectional view taken along lines 8—8 of FIG. 3 of another embodiment with both the signal wire and insulated sensor wire attached.

A plurality of bores 24, illustrated best in FIGS. 7 and 8, are located through the top plate 18 in spaced relationship to the fingers 22. These bores 24 are located as clusters or in some geometrical array as to be in direct correspondence with the workpiece pad substrate. The invention allows the holes to be spaced as close as 0.20 (0.508 millimeters) providing service for dense microcircuits, such as now presently in use. The bores 24 are also located directly above the body cavity 12 in all instances.

Figures 4, 5, 6:
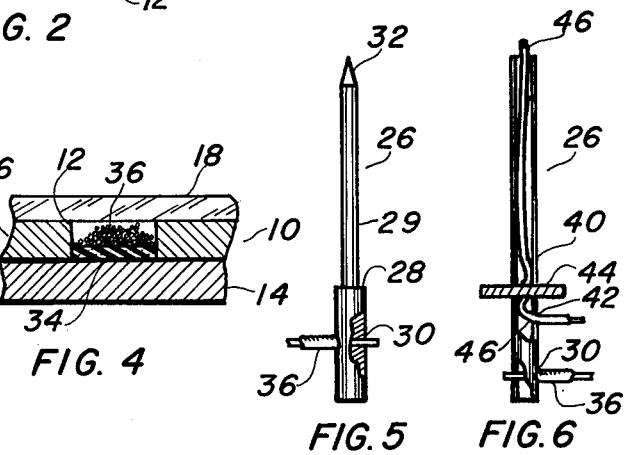
FIG. 4 is a partial cross-sectional view of the preferred embodiment depicting the wires within the cavity in the body taken partially along lines 4—4 of FIG. 1.
FIG. 5 is an elevation view of a probe removed from the assembly with a signal wire attached.
FIG. 6 is an elevation view of a probe in another embodiment removed from the assembly with a signal wire attached, also an insulated sensor wire disposed within the hollow body.

A plurality of probe pins 26, individually exhibited as removed from the assembly are shown in FIG. 5, and consist of a solid cylindrical body 29 having a shoulder 28 on the first or bottom end. This bottom end is larger in diameter creating the shoulder 28 at right angles to the body 29 perhaps one third of the lower portion. The bottom end is substantially flat and this longer portion further contains a hole 30 therethrough in a centralized location. The second or top end contains a sharp point 32 tapering from the cylindrical body 29. The top end is so configured as to slideably penetrate the bores 24 in the top plate 18. The thickness of the plate 18 and diameter of the pins 26 limit the lateral movement and yet allow vertical motility.

A resilient pad 34 is disposed within the cavity 12 of the body 10. This pad is flat and is cut into the same configuration as the cavity and is inserted therein and may be attached with adhesive or the like or may be a close fit to maintain its location through its compression on the sides of the cavity. The material may be any resilient substance such as rubber, neoprene, isoprene, styrene, butyl, nitrile, urethane, silicone, or the like having the characteristics of compressibility combined with memory returning the material to its original condition after being condensed in size. The pad 34 is in direct contact with the pins 26. The bottom flat end of the pin 26 is not only contiguous but slightly compresses the material of the pad 34. This tension urges the shoulder of the pin 28 into contact with the underside of the top plate 18 maintaining a semi-rigid status of the pin. When the workpiece is placed onto the pin sharp points 32, the pads of the node points or inspection points in the substrata are contacted and maintained in continuity by the action of the pad 34 forcing each individual pin 26 into compliance. This s1multaneous action allows each and every pin to embrace the workpiece regardless of the irregularities of the surface achieving the object of the invention.

An insulated signal wire 36 is individually connected to the hole 30 in each one of the pins 26. The wire is of a metallic substance, such as copper, with the encompassing electrically insulating sheath of a thermoplastic material. The wire 36 is permanently attached to the pin hole 30 by any suitable means, such as crimping, welding, with soldering with a dissimilar metal such as a lead-tin combination being preferred.

At least one connector 38, shown in FIG. 1, is affixed to the external surface of the body 10 at a point adjacent to the cavity 12. This connector 38 may be any type suitable for the application, such as a ribbon wire style having multiple contact points. The invention is not limited to any specific connector, as all work with equal ease and in all cases act as detachable interconnecting means between the invention and the external testing equipment. The wires are positioned in bundles from the pins 26 to the connector 38 through the cavity 12 and interlace between the aray of pins 26 in so doing any number of connectors 28 may be employed by the fixture, as all four sides are available and may provide attaching points thereto.

In another embodiment, best displayed in FIGS. 6 and 8, the probe pin 26 is comprised of a hollow cylindrical body 40 with a wire opening 42 located directly above the hole 30 for the signal wire 36. This probe also employs a retaining pin 44 that penetrates the body 40 and is at right angles near the midpoint. The pin 44 is retained by a forced fit, crimping or soldering and acts in the same manner as the shoulder 28 of the preferred embodiment captivating the probe pin within the cavity 12 while being slideably retained inside the bores 24 of the top plate 16. An insulated sensor wire 46 penetrates the hollow portion of the body 40 through the hole 42 and is disposed within, by passing the retaining pin 44 on one side. The sensor wire 46 extends slightly beyond the second end of the probe pin 26 allowing the wire to be compressed into the hollow portion of the body 40 when the probe is in contact with the workpiece. The exposed end of the wire 46 has the insulation stripped from the extended tip allowing an electrical contact to be made while still providing isolation from the body 40. The sensor wire 46 leaves the probe 26 through the hole 30 and is nested in the cavity of the body 12 along with the signal wire 36 terminating at the connector 38. This arrangement allows a signal, in the form of direct current voltage, to be introduced through the connector 38 to the node point on the workpiece. This signal indicates compliance by energizing an indicator, such as a light emitting diode in visual display. Continuity of the circuit board workpiece is simultaneously and independently achieved through the cylindrical body 40 allowing not only the traces on the workpiece to be verified, but the independent compliance of each probe may also be confirmed.

While the invention has been described in complete detail and pictorially shown in the accompanying drawing it is not to be limited to such details, since many changes and modifications may be in the invention without departing from the spirit and the scope thereof. Hence, it is described to cover any and all modifications and forms which may come within the language and scope of the appended claims.

What is claimed is:

1. A microelectronic circuit board node point and inspection point continuity testing fixture comprising:
    (a) a body having a cavity located therein;
    (b) a top plate having a plurality of bores clustered in geometrical array directly aligned with said cavity and juxtapositioned with said body;
    (c) attaching means to fasten said top plate to said body for unitary containment therewith;
    (d) a plurality of probe pins having a hole therethrough on the first end;
    a solid cylindrical body having a first and second end;
    a shoulder on said first end having a larger diameter than the second and a flat terminating surface for captivating said pin within said cavity while slideably retained within said top plate bores;
    a tapered sharp point on said second end for contacting said circuit board node points and inspection points when urged thereupon;
    said probe pins
    slideably penetrating said top plate bores with said first end exposed on one side and the second end exposed on the other for engagement of said circuit board points;
    (e) a resilient pad disposed within said body cavity contiguous with the first end of said probe pins providing compliance of said circuit board points when compressibly urged upon the exposed second end of said pins being individually under the influence of said pad in an independent manner compressibly forcing each pin into autonomous compliance;
    (f) a plurality of signal wires having an electrical insulated envelope with one end attached through said hole in the first end of said probe pin and being disposed within said body cavity for extending the electrical conductivity therefrom; and,
    (g) connector means attached to an external surface of said body having the other end of said signal wires affixed thereto for extending the electrical conductivity from said circuit board through said pins providing means to test node points and inspection points of said circuit board.

2. The invention as recited in claim 1 further comprising:
    a plurality of index fingers attached to said top plate in spaced relationship to said bores with probe pins penetrating therethrough for repeatedly indexing said pins to said node and inspection points of said circuit board.

3. The apparatus as in claim 1 wherein said body further comprises:
    (a) a base in flat rectangular form;
    (b) a spacer having a cavity centrally located therein with at least one side terminating at an edge juxtapositioned with said base forming a body with a cavity to receive said resilient pad; and,
    (c) attaching means to connect said base with said spacer.

4. The invention as in claim 3 wherein said base attaching means further comprise:
    a plurality of threaded fasteners penetrating said body for compressible retainment thereof.

* * * * *